United States Patent [19]

Olsen et al.

[11] Patent Number: 4,606,931
[45] Date of Patent: Aug. 19, 1986

[54] LIFT-OFF MASKING METHOD

[75] Inventors: Beverly L. Olsen, Brookfield, Conn.; Augustus C. Ouano, Santa Cruz, Calif.

[73] Assignee: International Business Machines Corporation, Armonk, N.Y.

[21] Appl. No.: 508,210

[22] Filed: Jun. 27, 1983

[51] Int. Cl.⁴ .................. B05D 3/06; B05D 5/00; C23C 14/04
[52] U.S. Cl. .................. 427/42; 204/192 S; 204/192 EC; 204/192 E; 204/192 N; 252/404; 427/259; 427/264; 430/917; 524/291; 560/75
[58] Field of Search ................ 524/291; 427/259, 42, 427/264; 430/917; 204/192 EC, 192 E, 192 N, 192 S; 560/75; 252/404

[56] References Cited

U.S. PATENT DOCUMENTS

| | | | |
|---|---|---|---|
| 3,285,855 | 11/1966 | Dexter et al. | 252/57 |
| 3,644,482 | 2/1972 | Dexter et al. | 260/473 |
| 3,873,361 | 3/1975 | Franco et al. | 430/324 |
| 4,004,044 | 1/1977 | Franco et al. | 427/43 |
| 4,035,276 | 7/1977 | Havas et al. | 204/192 EC |
| 4,090,006 | 5/1978 | Havas et al. | 428/81 |
| 4,202,914 | 5/1980 | Havas et al. | 427/38 |
| 4,279,986 | 7/1981 | Ohnishi et al. | 430/280 |
| 4,346,125 | 8/1982 | Kinsbron et al. | 427/96 |

OTHER PUBLICATIONS

Fredericks et al., *Polysulfone Lift-Off Masking Technique*, IBM Technical Disclosure Bulletin, 20(3), p. 989, Aug. 1977.

*Primary Examiner*—Evan K. Lawrence
*Attorney, Agent, or Firm*—Wolmar J. Stoffel

[57] ABSTRACT

A lift-off process for depositing a metallurgy layer on a substrate wherein the improvement is the use of a sacrificial masking layer that is substantially unaffected by exposure to high intensity radiation. The process includes the steps of (1) preparing a resin mixture of a polyaryl sulfone polymer, and a compound of the following:

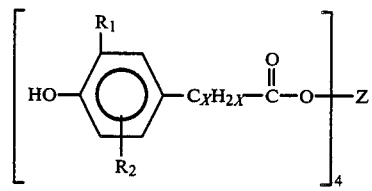

wherein $R_1$ is a methyl ethyl or an $\alpha$ branched alkyl group from 3 to 10 atoms, $R_2$ is a hydrogen, methyl, ethyl or a branched alkyl group of from 3 to 10 carbon atoms, and X has a value of 1 to 6, and Z is an aliphatic hydrocarbon of the formula $C_5H_8$ the compound being present in the amount of from 0.5 to 3.5% by weight of the polyaryl sulfone resin, (2) depositing a blanket sacrificial masking layer of the resin mixture on the surface of the semiconductor wafer, (3) selectively removing areas of the blanket masking layer to define the image of the desired metallurgy pattern, (4) depositing a blanket layer of conductive metal, and (5) exposing the resultant coated wafer to a solvent for the polyaryl sulfone resin to remove the masking layer in all the overlying metal areas.

7 Claims, 7 Drawing Figures

FIG. 1 — SPIN-ON AND CURE THE UNDERLAYER MATERIAL
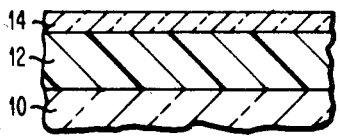
FIG. 2 — DEPOSIT OXYGEN REACTIVE ION ETCH BARRIER
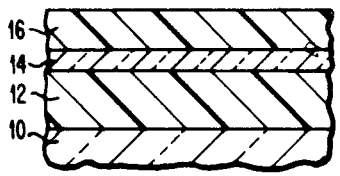
FIG. 3 — SPIN-ON AND CURE THE RESIST LAYER
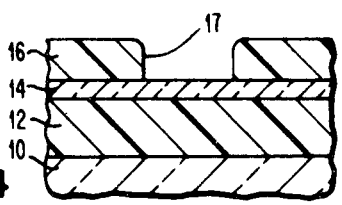
FIG. 4 — EXPOSE AND DEVELOP THE RESIST LAYER
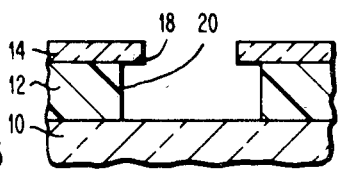
FIG. 5 — REACTIVE ION ETCH IN: $CF_4$ TO ETCH THE BARRIER IN $O_2$ TO ETCH THE UNDERLAYER
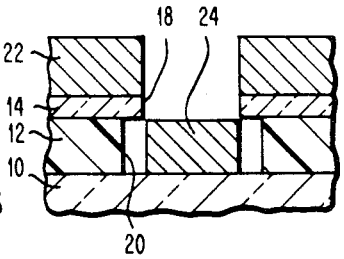
FIG. 6 — DEPOSIT METAL ONTO LIFT-OFF STENCIL
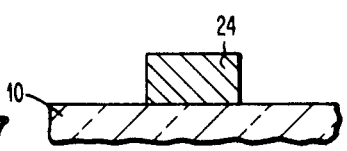
FIG. 7 — LIFT-OFF UNDERLAYER WITH SOLVENT

LIFT-OFF MASKING METHOD

DESCRIPTION

BACKGROUND OF THE INVENTION

This invention relates to fabrication techniques for producing micro-miniaturized electronic elements, more specifically to lift-off masking methods and other masking methods, still more specifically to a device fabrication method using sacrificial layers that are not adversely affected by radiation.

In the electronic industry reduced costs and higher operating performances of semiconductor devices are achieved by making the elements of the device smaller and closer together. This miniaturization inherently imposes a requirement for smaller and better defined interconnection metallurgy to connect the various active and passive elements of an integrated circuit device into an operative relationship.

Initially the interconnection metallurgy was fashioned by depositing a blanket layer of a metal on the surface of the substrate, depositing, exposing and developing a resist layer to define the desired metal pattern by leaving exposed the unwanted portions. The exposed areas were then removed by etching leaving the desired metallurgy pattern. As the metallurgy system of the integrated circuit devices became more miniaturized, new techniques known as lift-off, masking, stencil method, or expendable mask method was developed. U.S. Pat. Nos. 3,873,361; 4,004,044; 4,035,276; 4,090,006; and 4,202,914 disclose and claim various modifications of lift-off masking techniques. In lift-off technology a first sacrificial layer, usually of an organic polymeric material, is deposited on the substrate, possibly in combination with an overlying inorganic material, and the desired metallurgy pattern formed in the sacrificial layer using photolithographic techniques to define the openings. In order to provide good definition, necessary in micro-miniaturized metallurgy, it is usual to remove the exposed areas of the sacrificial layer with sputter etching techniques. A blanket layer of the desired metal is then deposited over the first layer after the resist layer has been removed. Thereafter the sacrificial layer is exposed to a solvent and the layer removed along with the overlying metal portions. The metal areas that are in direct contact with the substrate, which form the metallurgy, remain.

An acute problem with such lift-off fabrication techniques is that the underlying sacrificial mask layer can be difficult to dissolve and remove. Radiation causes cross-linking of the organic polymer which makes it more stable and harder to dissolve. The action of the solvent is unavoidably hampered by the overlying metal. Also the solvent selected must not adversely affect the associated layers and metallurgy of the device. With such constraints the cross-linking of the organic polymer material of the sacrificial layer significantly increases the etching time required for removal of the sacrificial layer. This makes the process expensive and also increases the probability of degrading the associated permanent device structure. Other related fabrication processes of electronic elements such as ion implantation in semiconductor devices, and metallurgy fabrication in the packaging technology are affected by the increased difficulty of etching or removing the masking layer after it has been exposed to radiation.

Radiation is involved in many processing operations associated with electronic device technology, i.e. sputter etching and deposition, vapor deposition using an electron beam for source vaporization, and ion implantation. In all of these operations a masking step is inherently involved.

In lift-off masking techniques it is known to use a polyaryl sulfone material as the material for the sacrificial mask. The material is commercially available and is derived from 2,2-bis(4-hydroxy-phenyl)propane (bisphenol A) and 4,4'-dichlorodiphenyl sulfone. The aromatic polysulfone polymer is stated to be relatively stable in radiation environments and can be dissolved with methyl pyrollidone (NMP). NMP is a desirable solvent because it effectively dissolves polysulfone polymer material, and its adverse effects on other parts of the electronic element is minimal. However, exposure of the polyaryl sulfone polymer to high energy radiation environments makes the material quite resistant to solvents, which is believed to be the result of cross-linking of the polysulfone polymer. This effect has been found to be so pronounced that the lift-off technique cannot use high energy radiation steps because the resultant polysulfone dissolution stage becomes inordinately long.

SUMMARY OF THE INVENTION

An object of this invention is to provide a masking process utilizing a stabilized polyaryl sulfone that can readily be dissolved and removed following exposure to high intensity radiation.

It is yet another object of this invention to provide a high resolution lift-off masking process for depositing a metal interconnection system on an integrated circuit semiconductor device which uses a stabilized polyaryl sulfone sacrificial masking layer.

The lift-off process of the invention for depositing metallurgy layers on substrates include the steps of (1) preparing a resin mixture of a polyaryl sulfone polymer and a compound of the formula

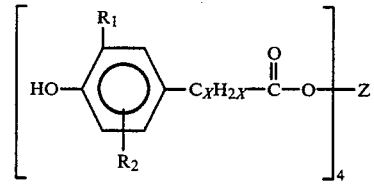

wherein R1 is a methyl, ethyl, or an α branched alkyl group of from 3 to 10 atoms, R2 is a hydrogen, methyl, alpha, or α branched alkyl group of from 3 to 10 carbon atoms, and X has a value of 1-6, and Z is an aliphatic hydrocarbon of the formula $C_5H_8$ in an amount of from 0.5 to 3.5% by weight of the polyaryl sulfone, depositing a blanket layer of the resin mixture on the surface of a semiconductor wafer, selectively removing areas of the blanket layer to define the reverse image of the desired metallurgy pattern, depositing a blanket layer of conductive metal, and exposing the resultant coated wafer to the solvent for the polyaryl sulfone resin to remove the layer in all overlying metal areas.

BRIEF DESCRIPTION OF THE DRAWINGS

FIGS. 1–7 are diagramatic cross-sectional views in broken section of an integrated circuit structure at successive steps during the fabrication of the thin film metal layer in accordance with preferred embodiment of the invention with the various figures accompanied by the associated flow chart description.

DESCRIPTION OF THE PREFERRED EMBODIMENT

FIGS. 1-7 illustrate the structure of the substrate and layers in the formation of a composite mask in accordance with the method of the present invention, as well as the utilization of the composition mixture for lift-off masking purposes. Also associated with each Figure is a method step which describes the associated operation. With reference to FIG. 1 there is shown a substrate 10 which in the preferred specific embodiment is an integrated circuit semiconductor device containing numerous active and passive semiconductor elements and an overlying insulating layer, as for example $SiO_2$. None of this structure is illustrated in substrate 10 since it does not constitute any part of the invention. It is understood, however, that substrate 10 could also be a ceramic substrate used in packaging of semiconductor devices where it is desired to form a fine definition metallurgy line pattern on the surface thereof. Substrate 10 could also be a semiconductor wafer in the process of being fabricated into an integrated circuit semiconductor device. The masking composition of this invention could also be used to form ion implantation masks used to define areas where the ions are implanted into the silicon or semiconductor substrate.

The first step in the process is to spin and cure a sacrificial masking layer 12. Layer 12 is formed by initially preparing a mixture of a resin of a polyaryl sulfone polymer and an additive that prevents further chemical reaction, i.e. cross-linking, when exposed to high intensity radiation. The polyaryl sulfone polymer resin suitable for use in the practice of the invention is commercially available and sold under the trademark of polysulfone 100P by ICI. In general the polyaryl sulfone material has a polymer unit of one of the following:

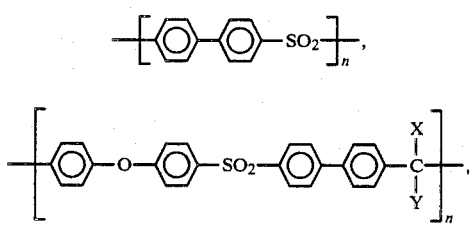

where x, y are methyl, ethyl, or α-branched alkyl groups of 3 carbon atoms, and

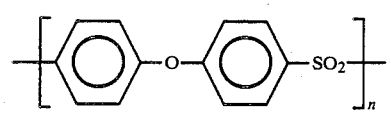

Any one or a mixture of the above polyaryl sulfone polymers can be used in the practice of the process of the invention.

The additive used in forming a mixture is described in U.S. Pat. No. 3,644,482. The additive compound has the following formula

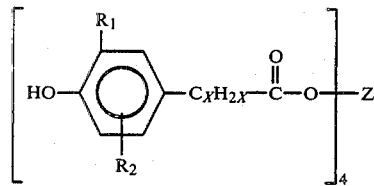

wherein R1 is a methyl, ethyl, or and α branched alkyl group of from 3 to 10 atoms, R2 is a hydrogen, methyl, ethyl, or an α—branched alkyl group of from 3 to 10 atoms, X has a value of from 1 to 6 and Z is an aliphatic hydrocarbon of the formula $C_5H_8$. The most preferred additive compound is sold under the trademark Irganox 1010 by Ciba-Geigy. The chemical name for the additive is tetrakis[methylene 3-(3', 5', di-tert-butyl-4'-hydroxyphenyl propionate] methane. The preferred amount of the additive is in the range of 0.1% to 5.0%, more preferably from 0.5 to 2.5% by weight of the resultant mixture. The resultant mixture of polyaryl sulfone polymer and additive is mixed and spun on the surface of substrate 10 resulting in a layer having a thickness in the range of 5000 Å to 20μ. In order to cure the layer 12, the substrate is heated at 250° C. for a time on the order of 30 minutes. Next, as indicated in FIG. 2, an oxygen reactive ion etchable barrier layer 14 is deposited on the top surface of layer 12. The barrier layer 14 is typically a layer of $SiO_2$ or $Si_3N_4$ having a thickness in the range of 500 Å to 4000 Å which can be deposited by sputter deposition or a chemical vapor deposition techniques which are well known in the semiconductor fabrication technology. If desired, an additional layer (not shown) can be formed between the layers 12 and 14. For example, the polyaryl sulfone layer 12 can be relatively thin, and another resin layer deposited. The layer 12 is generally considered a release layer, and the overlying resin layer provided for thermal stability. As indicated in FIG. 3 a resist layer 16 is deposited on the top surface of layer 14. The resist can be of any suitable type as for example a material sold under the trademark AZ1350J comprised of a novalak-type phenol formaldehyde resin and a photosensitive cross-linking agent that is commercially available from Shipley Corporation. Resist layer 16 is then exposed and developed to form the reverse image of the desired metallurgy pattern. The opening 17 in layer 16 depicts the desired metallurgy pattern. As indicated in FIG. 5, an opening 18 is formed in barrier layer 14 by any suitable technique using the resist layer 16 to define the opening. Opening 18 can be formed by reactive ion etching in a $CF_4$ plasma. Then opening 20 is formed in the sacrificial masking layer 12 preferably such that the opening undercuts the layer 14 as indicated in FIG. 5. Opening 20 can conveniently be formed by reactive ion etching in an oxygen atmosphere. At the same time that the opening 20 is formed, the remaining portions of layer 16 are also removed.

As indicated in FIG. 6 a blanket layer 22 of metal is deposited on the top surface of layer 14. Over opening 18 in layer 14 the metal layer is deposited directly on the top surface of substrate 10. The overhang of layer 14 permits the metal stripe 24 to be formed out of contact with the sidewalls of sacrificial masking layer 12. Layer 22 can be any suitable metal deposited by any suitable technique. A convenient method for depositing metal layer 22 is by evaporation of the metal where the source metal is heated and evaporated by an electron beam while contained in a water-cooled container. As indicated in FIG. 7, sacrificial masking layer 12 is removed along with all the overlying layers leaving stripe 24 bonded directly to substrate 10. Layer 12 is removed by subjecting it to a solvent that dissolves the material at a relatively rapid rate without significantly adversely affecting the remaining element on the substrate.

As mentioned previously, the masking layer 12 is unique in that it is chemically stable even though exposed to high intensity radiation. Radiation is encountered in many of the steps normally used to fabricate semiconductor devices. As for example, sputter deposition, as suggested for depositing layer 14, results in a significant exposure of radiation. The reactive sputter etching operation used to form openings 18 and 20 in layers 12 and 14 also result in a significant amount of radiation. Still further the deposition of metal layers 22 when done by evaporation where the source is heated by an electron beam also results in radiation. Alternately, if the layer were deposited by sputter deposition, radiation would be produced. It has been noted that radiation of an organic layer used for masking purposes will deteriorate the layer by causing oxidation and cracking However, polysulfone material is resistant to this type of deterioration. However, such material is prone to cross-linking when exposed to radiations which makes the material very difficult to dissolve at the final steps of the operation. As is clear from FIG. 6 the layer 12 is protected on the top and bottom sides by the layers 14 and 22 and on the bottom by substrate 10. Layer 12 is essentially exposed to the solvent only through the opening made for fashioning the metallurgy stripe 24. Any cross-linking of the material of layer 12 will materially decrease the rate at which it dissolves, thus lengthening the time necessary for removal of the layer. It has been discovered that the unique combination of a polyaryl sulfone polymer when combined with the aforedescribed additives quite unexpectedly is stable when exposed to radiation normally encountered in a number of processes used to fabricate semiconductor devices. Any suitable solvent can be used to dissolve layer 12. The preferred solvents for dissolving the polyaryl sulfone mixture are 1 methyl-2-pyrrolidinone, methylene chloride chloroform, butanoic acid 4- hydroxylactone, N, N dimethylformamide, and dimethylsulfoxide.

The following examples are included to illustrate the specific preferred embodiments of the invention and are not intended to unduly limit the scope thereof.

EXAMPLE I

A mixture of 20 parts by weight of ICI polyaryl sulfone 100P in normal methyl pyrollidinone was prepared. Several solutions were then made with varying weight percentages of additive Irganox 1010. The chemical formula for Irganox 1010 is tetrakis [methylene 3-(3', 5' di-tert butyl-4'-hydroxyphenyl) proprionate] methane. These solutions were prepared with 0, 0.1, 0.2, 0.3, 0.4, 0.5, 0.6, 0.8, 1.0, 1.5, 2.0, 2.5, 5.0 and 6.0% by weight of additive Irganox 1010. These solutions were used to make a film which served as lift-off layers in microelectronic fabrication. These structures were made in the following manner. Each mixture of polyaryl sulfone and Irganox 1010 was spun onto silicon substrates to produce film thicknesses of 2.0 microns. The samples were baked at 85° for 5 minutes and 250° for 20 minutes to thoroughly remove the solvent.

Silicon oxide was deposited on the film by plasma and chemical vapor deposition to a thickness of 2000 Å. A layer of high contrast photoresist was spun onto the siliconoxide surface to produce a thickness of one micron. A pattern was optically exposed and developed into the resist layer using a suitable developer.

The pattern was transferred into the under layers by a reactive ion etching process, by first etching in a $CF_4$ plasma to etch the silicon oxide layer and then in $O_2$ to etch the underlying sacrificial polyaryl sulfone layer. The resist patterned substrates were then placed in a high vacuum electron beam metallization evaporator. The system was pumped down to a pressure of $1 \times 10^{-7}$ Torr. Prior to evaporation the samples were heated to 160° and maintained at the temperature for the duration of the evaporation. 1.75 microns of aluminum-copper was then evaporated at a rate of 20 Å per second. The samples were removed from the evaporator after they cooled down to room temperature. A discontinuity of the deposited metal layer distinguishes the areas of the metal film which will be lifted off from those that remain on the substrate to form the circuit pattern. Lift-off of the polyaryl sulfone underlayer was achieved by soaking the samples in 80° C. in normal methylpyrollidinone. The lift-off time was the time required in the solvent to effect a complete removal of the sacrificial polyaryl sulfone layer and all of the overlying layers, i.e. the $SiO_2$ and Al Cu layer areas. The lift-off times for complete removal of the polyaryl sulfone layer and overlying layers for each sample were recorded and are as follows:

| Samples Percent Additive 1010 In Polyaryl sulfone | Lift-off Time (Minutes) |
| --- | --- |
| 0 | 120 |
| 0.1 | 100 |
| 0.2 | 95 |
| 0.3 | 83 |
| 0.4 | 72 |
| 0.5 | 65 |
| 0.6 | 57 |
| 0.8 | 45 |
| 1.0 | 30 |
| 1.5 | 30 |
| 2.0 | 30 |
| 2.5 | 40 |
| 5.0 | 105 |
| 6.0 | 120 |

The lift-off time was reduced considerably with the addition of additive Irganox 1010 to polyaryl sulfone in the range of 0.5 to about 4 percent by weight.

As the table indicates the lift-off time which is directly related to the solubility of the polyaryl sulfone sacrificial masking layer is reduced considerably with the addition of Irganox 1010 to the polyaryl sulfone polymer layer. As is evident, the optimum range is to be from 1 to 2% by weight of the additives. Also, large amounts of the additive are as ineffective as none. The example indicates that there is a critical range of the additive in the polyaryl sulfone mixture.

EXAMPLE II

A mixture of ICI polyaryl sulfone 100P in normal methylpyrollidinone was added to Irganox 1093 to form a number of mixtures of varying percents of additive. Irganox 1093 has the chemical formula 0,0-di-n-octadecyl-3,5-di-tert-butyl-4-hydroxybenzyl phosphonate.

Samples with the additive compositions listed below were prepared in the manner described in Example I. The polyaryl sulfone and Irganox 1093 formed the sacrificial masking layer. All of the processing steps were identical to that described in Example I. The lift-off time for each sample is set forth in the table.

| Percent Additive 1093 In Polysulfone Sample | Lift-off Time (Minutes) |
| --- | --- |
| 0 | 120 |
| 0.2 | 120 |
| 0.4 | 120 |
| 0.6 | 120 |
| 0.8 | 120 |
| 1.0 | 120 |
| 2.0 | 120 |
| 2.5 | 120 |
| 5.0 | 120 |

As the results indicate, Irganox 1093 had no beneficial effect in preserving the chemical stability of the film, i.e. preventing cross-linking, which is directly related to the solubility. Note that the polyaryl sulfone with no additives is identical to the remaining samples with different amounts of additives.

EXAMPLE III

A mixture of ICI polysulfone 100P in normal methylpyrollididone was added Irganox 1035 to form a number of mixtures of varying additive. Irganox 1035 has the following chemical formula:

Thiodiethylene-bis-(3,5-di-tert-butyl-4-hydroxy)hydro cinnamate.

Samples were prepared with the percentages of additive, by weight, listed below in the manner described in Example I where the polyaryl sulfone and Irganox 1035 formed the underlayers. All the processing steps were identical to that set forth in Example 1. The lift-off times for each sample is noted below:

| Percent Additive 1035 In Polysulfone Sample | Lift-off Time (Minutes) |
| --- | --- |
| 0 | 120 |
| 0.2 | 120 |
| 0.4 | 120 |
| 0.6 | 120 |
| 0.8 | 120 |
| 1.0 | 120 |
| 2.0 | 120 |
| 2.5 | 120 |
| 5.0 | 120 |

As the table indicates, the Irganox 1035 had no beneficial effect in preventing cross-linking of the underlayer as indicated by the solubility, exposed to high intensity radiation.

EXAMPLE IV

Irganox additive 1010, which is the preferred additive in the practice of the invention, was mixed with Shipley AZ1350J resist in various weight percentages indicated in the following table. AZ1350J resist is a polymerizable phenolic resin with the following formula:

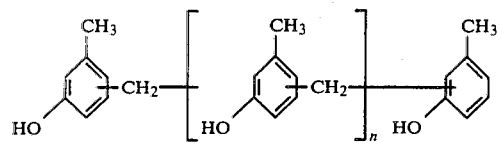

The AZ1350J and Irganix 1010 mixture was used to form the sacrivicial layer of all the substrates processed in this Example. The lift-off times for each Example is noted below.

| Percent Additive 1010 In AZ2350J Resist Sample | Lift Off Time (Minutes) |
| --- | --- |
| 0 | 140 |
| 0.2 | 140 |
| 0.4 | 140 |
| 0.6 | 140 |
| 0.8 | 140 |
| 1.0 | 140 |
| 1.5 | 140 |
| 2.0 | 140 |
| 2.5 | 140 |
| 5.0 | 140 |

The additive Irganox 1010 did not reduce the lift-off times when used with shipley AZ 2350J resist as an underlayer. This example illustrates the selectivity of the additive to only polyaryl sulfone polymers for providing a resistance to cross linking.

As indicated, the combination of the preferred additive with a resist polymer other than polyaryl sulfone did not produce any beneficial effect in reduction of solubility over the range tested when exposed to high intensity radiation.

As the foregoing Examples indicate, the composition of the invention of a polyaryl sulfone polymer with the aforedescribed additive produces an unexpected and beneficial result over a relatively narrow range of weight ratios. Examples II and III indicate that the preferred polyaryl sulfone when combined with different but generally similar additives does not reduce cross linking. Also the preferred additive when combined with another resin other than polyaryl sulfone does not produce applicant's beneficial and unexpected results.

While the invention has been described relative to the three preferred embodiments herein, it is apparent that other modifications may be practiced by those having working skill within this technology without departing from the essential scope of this invention.

We claim:

1. An improved lift-off process that is tolerant of high intensity radiation for depositing a metallurgy layer on a substrate comprising
preparing a mixture of a polyaryl sulfone polymer, and a compound of the formula

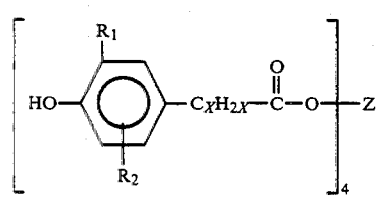

where $R_1$ is methyl, ethyl or an α branched alkyl group of from 3 to 10 carbon atoms, $R_2$ is hydrogen, methyl, ethyl or an α branched alkyl group of from 3 to 10 atoms, X has a value of from 1 to 6, and Z is the aliphatic hydrocarbon of the formula $C_5H_8$ wherein said compound is present in the mixture in an amount in the range of from 0.5 to 3.5% by weight, of the mixture, depositing a blanket sacrificial masking layer of said mixture on the surface of said substrate and heating to harden the layer, selectively removing areas of said blanket sacrificial masking layer to expose surface areas of the substrate to produce openings that define the image of the desired metallurgy pattern, depositing a blanket layer of metal over the surface of said hardened sacrificial masking layer and the exposed surface areas of said substrate, the carrying out of said step of selectively removing areas of the sacrificial masking layer and/or the step of depositing a blanket layer of metal incorporating the use of high intensity radiation, and exposing the resultant layered substrate to a solvent for the polyaryl sulfone polymer material of said sacrificial masking layer thereby removing said masking layer and the overlying metal layer areas but leaving intact the metal layer areas in said openings in contact with said substrate.

2. The process of claim 1 wherein said polyaryl sulfone is selected from the group consisting of:

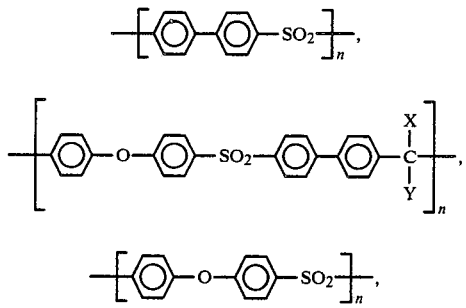

and mixtures thereof, where X and Y are methyl, ethyl or an α-branched alkyl group of 3 carbon atoms.

3. The process of claim 1 wherein said compound is tetrakis [methylene 3-(3', 5'di-tert-butyl-4'-hydroxphenyl) propionate] methane.

4. The method of claim 1 wherein a blanket layer of an inorganic material selected from the group consisting of $SiO_2$, and $Si_3N_4$ is deposited over said blanket sacrificial masking layer immediately after deposition of said blanket sacrificial masking layer, and subsequently openings are formed through said blanket layer of inorganic material overlying said areas of said blanket sacrificial material layer to be selectively removed.

5. The method of claim 1 wherein a solvent is combined with said polyaryl sulfone polymer prior to its deposition, said solvent being selected from the group consisting of 1 methyl-2-pyrrolidinone, methylene chloride, chloroform, butanic acid, 4-hydroxylactone, N, N dimethylformamide, dimethylsulfoxide, and mixtures thereof.

6. The method of claim 5 wherein said solvent for the polyaryl sulfone polymer is 1-methyl-1-pyrrolidinone.

7. The method of claim 1 wherein said compound is present in said mixture in an amount in the range of 1 to 2 percent by weight.

* * * * *